US007031181B1

(12) United States Patent
Happ

(10) Patent No.: US 7,031,181 B1
(45) Date of Patent: Apr. 18, 2006

(54) MULTI-PULSE RESET WRITE SCHEME FOR PHASE-CHANGE MEMORIES

(75) Inventor: Thomas Happ, Pleasantville, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/995,644

(22) Filed: Nov. 23, 2004

(51) Int. Cl.
*G11C 11/00* (2006.01)

(52) U.S. Cl. ....................................... 365/148; 365/114

(58) Field of Classification Search ................ 365/148, 365/114
See application file for complete search history.

(56) References Cited

U.S. PATENT DOCUMENTS

| | | | | |
|---|---|---|---|---|
| 6,545,903 | B1 * | 4/2003 | Wu | 365/148 |
| 6,625,054 | B1 * | 9/2003 | Lowrey et al. | 365/148 |
| 6,673,648 | B1 | 1/2004 | Lowrey | |
| 6,791,107 | B1 | 9/2004 | Gill et al. | |
| 2003/0123277 | A1 * | 7/2003 | Lowrey et al. | 365/148 |

OTHER PUBLICATIONS

Ha, Y. H. et al., "An Edge Contact Type Cell for Phase Change RAM Featuring Very Low Power Consumption," Symposium on VLSI Technology Digest of Technical Papers, pp. 2, (2003).

Horii, H. et al., "A Novel Cell Technology Using N-Doped GeSbTe Films for Phase Change RAM," Symposium on VLSI Technology Digest of Technical Papers, pp. 2, (2003).

Hwang, Y.N. et al., "Full Integration and Reliability Evaluation of Phase-Change RAM Based on 0.24 μm-CMOS Technologies," pp. 2, (2003).

Lai, Stefan et al., "OUM-A 180 nm Nonvolatile Memory Cell Element Technology for Stand Alone and Embedded Applications," IEDM Technical Digest, Session 36.5, pp. 4, (2001).

Pellizzer, F. et al., "Novel μTrench Phase-Change Memory Cell for Embedded and Stand-Alone Non-Volatile Memory Applications," VLSI Technology Digest of Technical Papers, pp. 2, (2004).

* cited by examiner

*Primary Examiner*—Michael Tran
(74) *Attorney, Agent, or Firm*—Dicke, Billig, Czaja, PLLC

(57) ABSTRACT

A memory cell device and method that includes a memory cell, and first and second write pulse signals. The memory cell has phase-change material capable of being set and capable of being reset. The first and second write pulse signals are used for a single reset operation of the memory cell. The first write pulse signal heats and melts a first portion of the phase-change material of the memory cell. The second write pulse signal heats and melts a second portion of the phase-change material of the memory cell.

20 Claims, 6 Drawing Sheets

MULTI-PULSE RESET WRITE SCHEME FOR PHASE-CHANGE MEMORIES

BACKGROUND

The present invention relates to electrical phase-change memories. In particular, a system and method of operation are provided for the phase-change memory cells using an multi-pulse reset write scheme. Phase-change materials may exhibit at least two different states. Consequently, phase-change material may be used in a memory cell to store a bit of data. The states of a phase change material may be referred to as amorphous and crystalline states. These states may be distinguished because the amorphous state generally exhibits higher resistivity than does the crystalline state. Generally, the amorphous state involves a more disordered atomic structure, while the crystalline state involves an ordered lattice.

Phase change in the phase-change materials may be induced reversibly. In this way, the memory may change from the amorphous to the crystalline state, and vise versa, in response to temperature changes. The temperature changes to the phase-change material may be effectuated in a variety of ways. For example, a laser can be directed to the phase-change material, current or voltage may be driven through the phase change material, or current or voltage can be fed through a resistive heater adjacent the phase change material. With any of these methods, controllably heating the phase-change material causes controllable phase change with the phase-change material.

When a phase-change memory comprises a memory array having a plurality of memory cells that are made of phase-change memory material, the memory may be programmed to store data utilizing the memory states of the phase-change material. One way to read and write data in such a phase-change memory device is to control a current (or a voltage) that is directed through the phase-change material. Controlling current or voltage in this way also can correspondingly control temperature within each memory cell. Typically, when current is driven through the phase-change material, the induced heat tends to be concentrated in the center of the cell. This can cause significant overheating in the center of the phase-change material and thereby negatively impact the device reliability.

For these and other reasons, there is a need for the present invention.

SUMMARY

One aspect of the present invention provides a memory cell device and method that includes a memory cell, and first and second write pulse signals. The memory cell has phase-change material capable of being set and capable of being reset. The first and second write pulse signals are used for a single reset operation of the memory cell. In one case, the first write pulse signal heats and melts a first portion of the phase-change material of the memory cell. The second write pulse signal heats and melts a second portion of the phase-change material of the memory cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
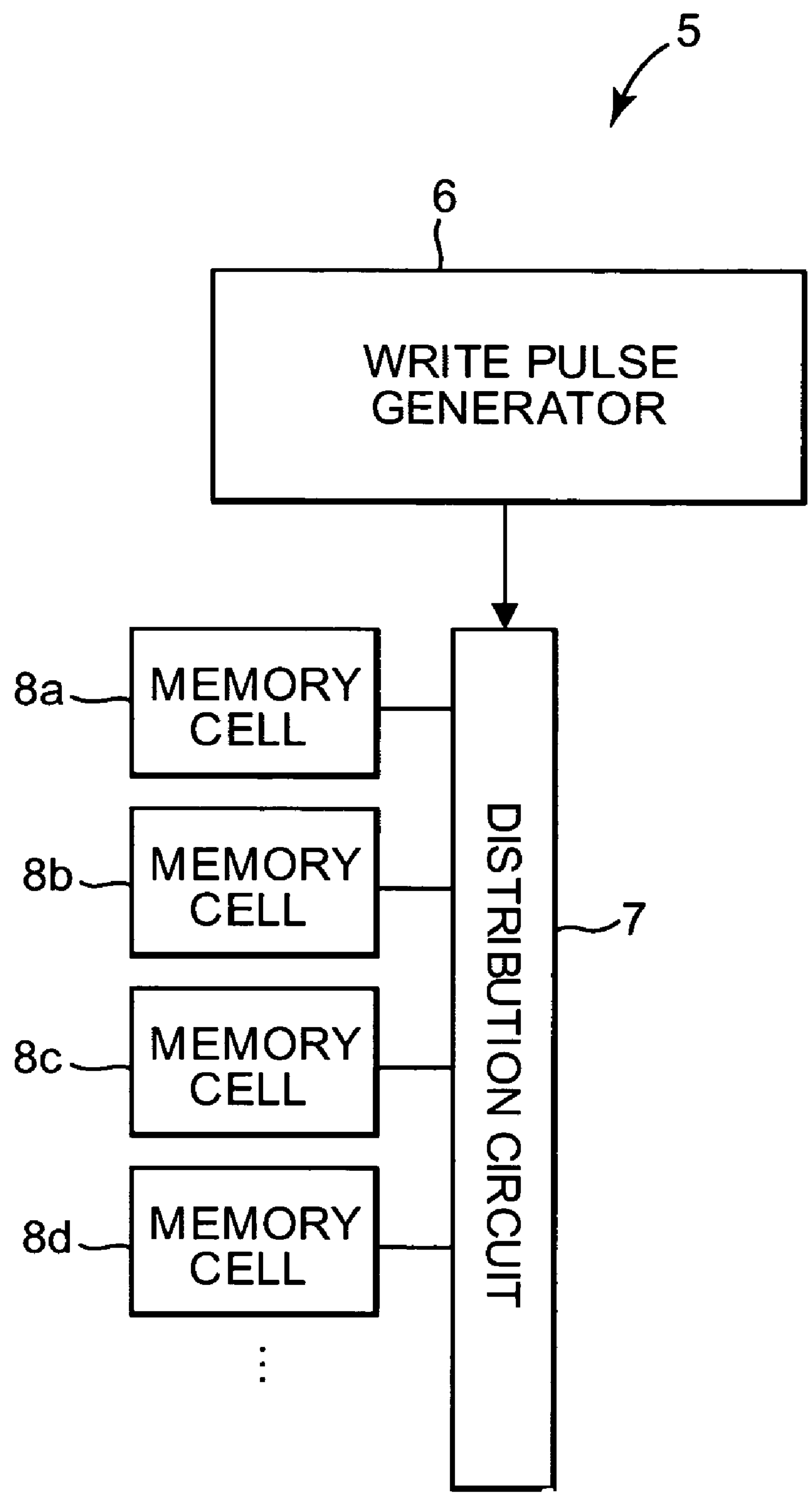
FIG. 1 illustrates a block diagram of a memory cell device.

FIG. 1 illustrates a block diagram of a memory cell device 5. Memory cell device 5 includes write pulse generator 6, distribution circuit 7, and memory cells 8*a*, 8*b*, 8*c*, and 8*d*. In one embodiment, memory cells 8*a*–8*d* are phase-change memories that are based on amorphous to crystalline phase transition. In one embodiment, write pulse generator 6 generates current or voltage pulses that are controllably directed to memory cells 8*a*–8*d* via distribution circuit 7. In one embodiment, distribution circuit 7 is a plurality of transistors that controllably direct current or voltage pulses to the memory and in another, is a plurality of transistors that controllably direct current or voltage pulses to heaters adjacent to the memory.

In one embodiment, memory cells 8*a*–8*d* are made of phase-change materials that may be changed from amorphous state to crystalline state or crystalline state to amorphous state under the influence of temperature change. The amorphous and crystalline states thereby define two bit states for storing data within memory cell device 5. The two bit states of memory cells 8*a*–8*d* differ significantly in their electrical resistivity. In the amorphous state, the phase-change materials will exhibit significantly higher resistivity than they will in the crystalline state. In this way, by reading the cell resistance, the bit value assigned to a particular memory cell can be determined.

In order to program a memory cell 8a–8d within memory cell device 5, write pulse generator 6 generates a current or voltage pulse for heating the phase-change material in the target memory cell. In one embodiment, write pulse generator 6 generates an appropriate current or voltage pulse and distribution circuit 7 distributes the pulse to the appropriate target memory cell 8a–8d. The current or voltage pulse amplitude and duration is controlled depending on whether the memory cell is being set or reset. Generally, a "set" operation of a memory cell is heating the phase-change material of the target memory cell above its crystallization temperature (but below its melting temperature) long enough to achieve the crystallized state. Generally, a "reset" operation of a memory cell is quickly heating the phase-change material of the target memory cell above its melting temperature, and then quickly quenching the material, thereby achieving the amorphous state.

In order to reach the target melting temperature required to reset a memory cell, a relatively high amplitude current or voltage pulse of short duration is sent from write pulse generator 6 to the target memory cell 8a–8d causing the phase-change material to melt and amorphize during the subsequent quench cooling. In order to reach the target crystallization temperature to set a memory cell, a relatively lower amplitude current or voltage pulse of relatively longer duration is sent from write pulse generator 6 to the target memory cell 8a–8d thereby heating up the phase-change material over its crystallization temperature lowering its resistance.

In this way, two states are defined for each memory cell. In the reset state the phase-change material is in its amorphous and has a high resistivity. In the set state the phase-change material is in its crystalline state with with lower resistivity.

Figure 2:
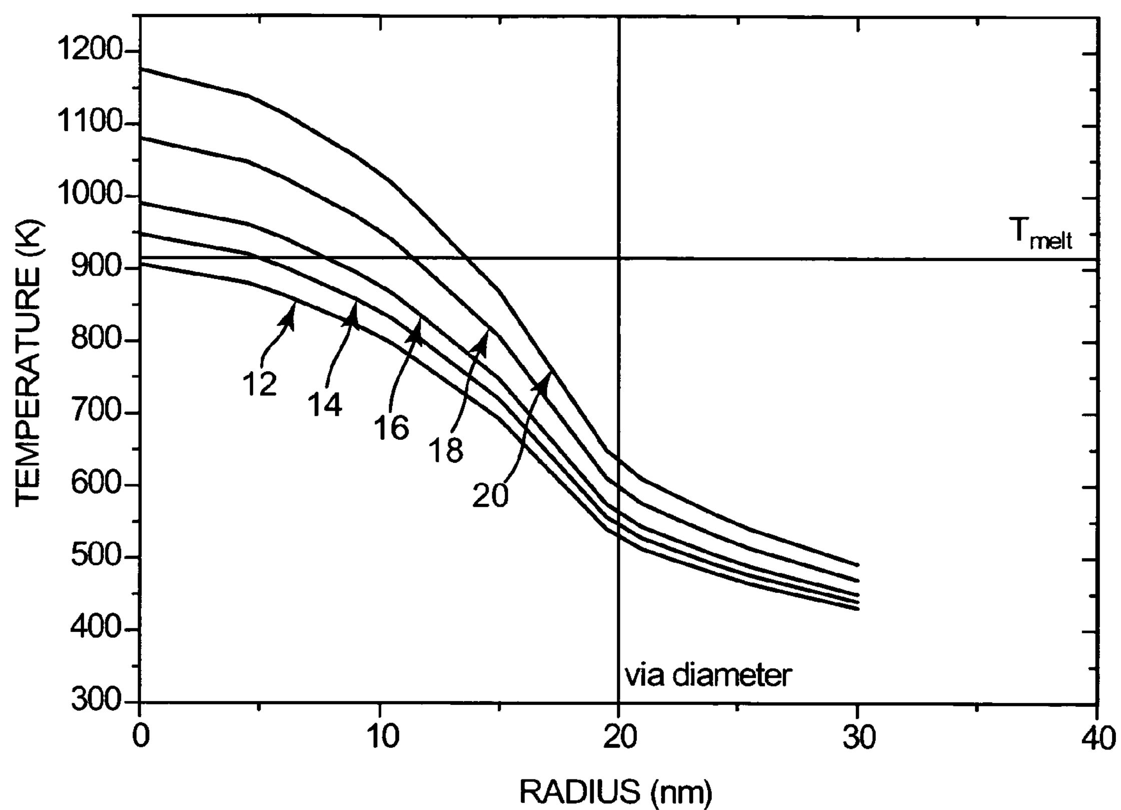
FIG. 2 is a graph showing the relationship of temperature to radius for various pulses driven through a phase-change memory cell.

FIG. 2 illustrates a graph comparing the temperature of phase-change material in a memory cell as it relates to the radius of the phase-change material. A plurality of pulse signals are illustrated, and each pulse is driven through a memory cell having phase-change material initially in the crystalline state. In the illustration, temperature increases up the vertical axis. In some configurations, the phase-change material in a memory cell heats from its center outward. The center of the phase-change material of a memory cell is illustrated on the left side, and moving along the horizontal axis to the right coincides with moving from the center of the phase-change material to its outer edge. First through fifth exemplary pulse signals 12, 14, 16, 18 and 20 are illustrated. First pulse 12 has the lowest current or voltage and fifth pulse 20 has the highest, as will be discussed more fully below. The melt temperature of the phase-change material in a memory cell is illustrated with the horizontal line $T_{melt}$.

Figure 3:
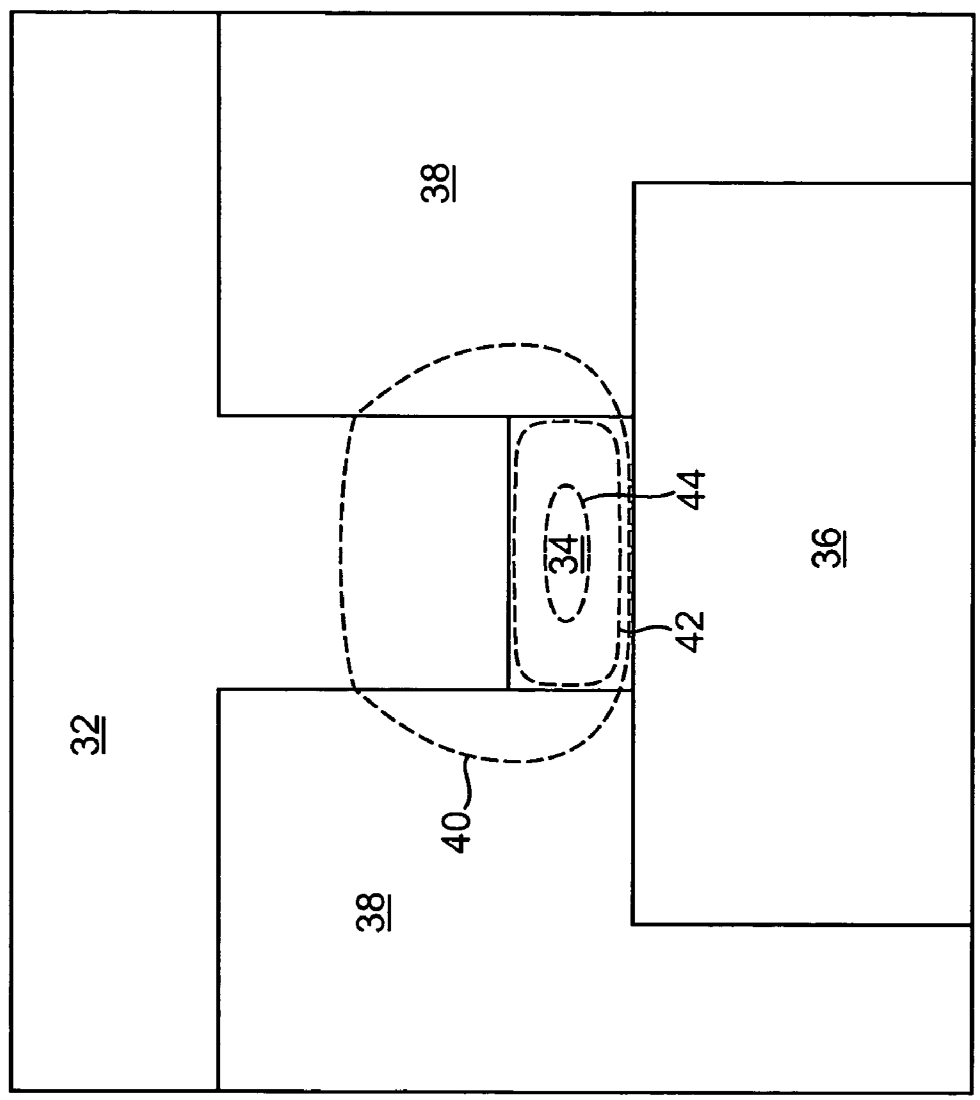
FIG. 3 illustrates a cross-sectional view through a phase-change memory cell with a temperature contour plot.

FIG. 3 illustrates a cross-sectional view through an exemplary memory cell 30 through which first through fifth exemplary pulse signals 12, 14, 16, 18 and 20 from FIG. 2 can be driven. In one embodiment, memory cell 30 includes first contact 32, second contact 36, phase-change material (PCM) 34, and side insulators 38. First and second contacts 32 and 36 may be controlled to drive a pulse through PCM 34 thereby selectively heating it. For example, second contact may be coupled to a transistor that switches a current or voltage pulse thereby selectively driving a current though PCM 34, and first contact 36 may be coupled to a word line or similar component.

During a reset operation, the application of first, second, third, fourth or fifth exemplary pulse signals 12, 14, 16, 18 or 20 melts and amorphizes the material of PCM 34. In order to adequately melt PCM 34 and perform the reset, a pulse with sufficient energy must be selected. This typically means that the center of PCM 34 will be overheated. For the given exemplary pulse signals 12–20 in FIG. 2, first signal 12 cannot be used as it does not have enough energy to melt even the center of PCM 34, as its peak temperature is below the melt temperature $T_{melt}$ of the phase-change material. If an insufficient amount of PCM 34 is amorphized during the reset operation, memory cell 30 may only display a small read margin producing a poor read signal. The fifth signal 20 has more energy and melts both the center of PCM 34 and a portion of the radius moving outward from the center. Selecting this pulse signal, however, will overheat the center of PCM 34 thereby wasting energy and risking segregation or chemical reactions of the material. Such phase separation of the material may cause irreparable damage to memory cell 30.

Dotted lines 40, 42 and 44 in FIG. 3 illustrate selected regions a partial temperature gradient overlaid on memory cell 30. Since the phase-change material in a memory cell typically heats from its center outward, the temperature with region 44 is the highest, while the temperature outside region 40 is the lowest, with the temperature gradually changing therebetween. Where a high energy pulse such as fifth signal 20 is used, the temperature within the temperature area indicated by 44, may be much higher than the melt temperature, thereby wasting energy in that region and also risking segregation of the material there. In order to reset memory cell 30, the temperature in region 42 must reach the melt temperature $T_{melt}$ of the phase-change material, and thus, when this is achieved, the temperature with region 40 is higher than the melt temperature $T_{melt}$.

Figure 4:
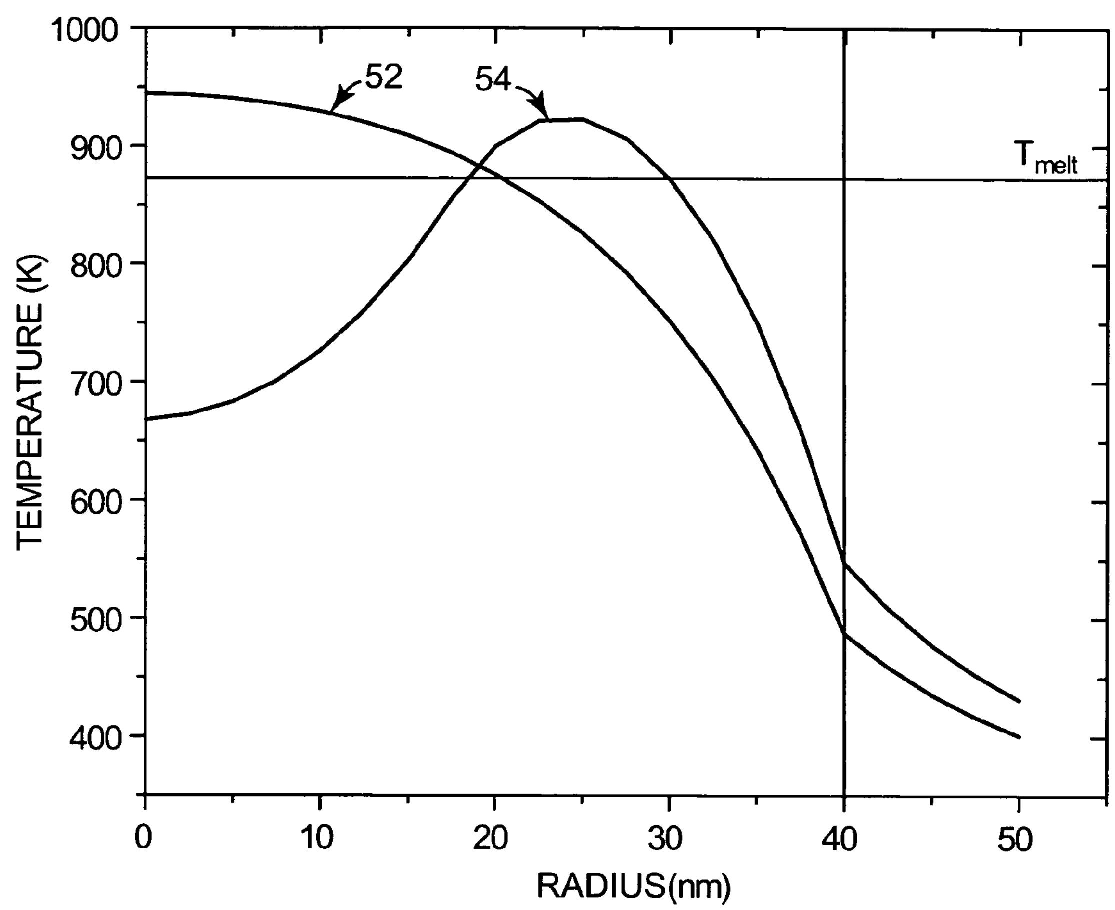
FIG. 4 is a graph showing the relationship of temperature to radius for two pulses driven through a phase-change memory cell in accordance with the present invention.

FIG. 4 illustrates a graph comparing the temperature of phase-change material in a memory cell as it relates to the radius of the phase-change material. A first pulse signal 52 and a second pulse signal 54 are illustrated. Each pulse is driven through a memory cell having phase-change material during a single reset operation in accordance with the present invention. In this way, a reset is not performed with a single high-current or high-voltage pulse, but rather with a plurality of lower current or lower voltage pulses separated by enough time in between them to allow partial amorphization of the phase change material.

As with FIG. 2, in the graph of FIG. 4, temperature increases up the vertical axis. In addition, the center of the phase-change material of a memory cell is illustrated on the left side, and moving along the horizontal axis to the right coincides with moving from the center of the phase-change material to its outer edge. First and second reset pulse 52 and 54 are illustrated. First pulse 52 is the first pulse used in a single reset operation and second pulse 54 is the second. One skilled in the art will understand that additional pulses in the single reset operation may also be used in conjunction with the present invention. The melt temperature of the phase-change material in a memory cell is illustrated with the horizontal line $T_{melt}$.

Figure 5A:
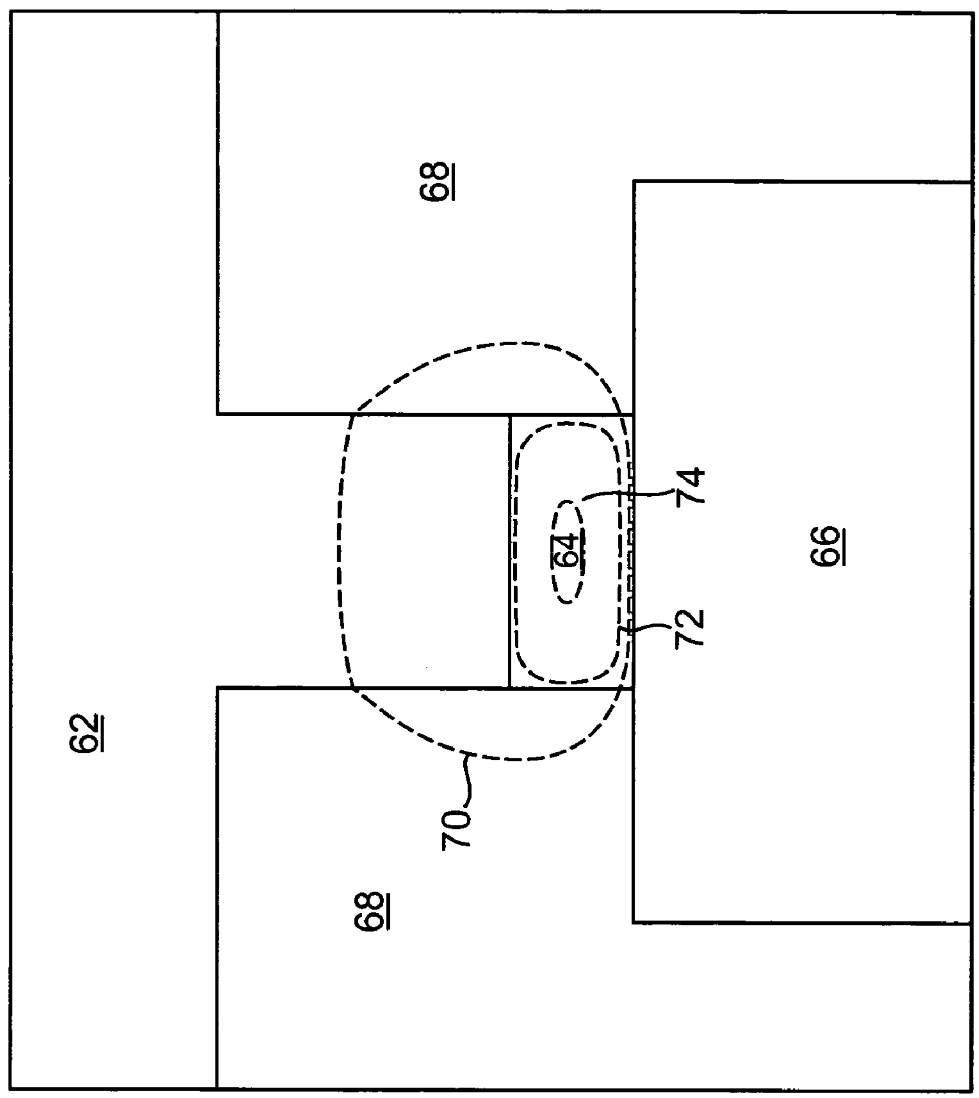
FIG. 5A illustrates a cross-sectional view through a phase-change memory cell with a temperature contour plot after a single pulse has passed though in accordance with one embodiment of the present invention.

FIG. 5A illustrates a cross-sectional view through an exemplary memory cell 60 through which first and second reset pulse signals 52 and 54 from FIG. 4 are driven. In one embodiment, memory cell 60 includes first contact 62, second contact 66, phase-change material (PCM) 64, and side insulators 68. First and second contacts 62 and 66 may be controlled to drive a pulse through PCM 64 thereby selectively heating it. For example, second contact may be coupled to a transistor that switches a current or voltage pulse thereby selectively driving a current though PCM 64, and first contact 66 may be coupled to a word line or similar component.

During a single reset operation, first pulse signal 52 is driven through PCM 64 to melt at least a portion of it. The level of energy in first pulse 52 is selected such that it is high enough to melt part of the PCM 64, but not the entire volume. This melted portion is then amorphized during subsequent brief quenching. In this way, only a small subregion of PCM 64 is amorphized during the subsequent cooling. This subregion of amorphized material will have a much higher resistivity (for example, 3 orders of magnitude higher) than will the surrounding crystalline regions. In FIG. 5A, this small subregion of PCM 64 that is melted and amorphized is region 74 at its center. The temperature is progressively lower in the concentric regions 72 and 70, such that melt temperature $T_{melt}$ is not reached in those regions with the first pulse 52. First pulse signal 52 is also illustrated in FIG. 4 over the melt temperature $T_{melt}$ of the phase-change material near the center of PCM 64.

Figure 5B:
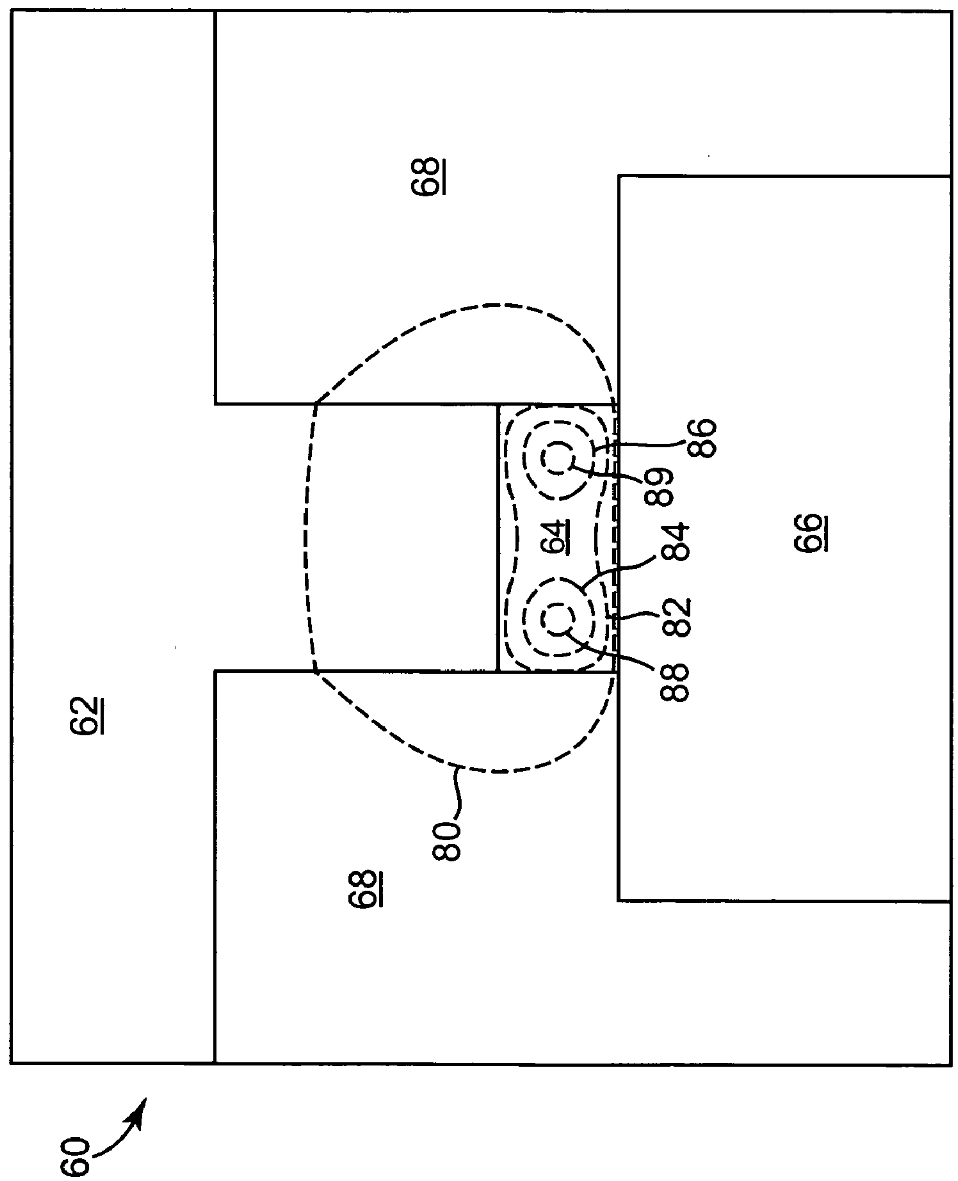
FIG. 5B illustrates a cross-sectional view through a phase-change memory cell with a temperature contour plot after a second pulse has passed through in accordance with one embodiment of the present invention.

Next during the single reset operation, second pulse signal 54 is driven through PCM 64 to again melt and amorphize material. Since the region just heated and quenched by first pulse signal 52 has much higher resistivity than surrounding regions, second pulse signal 54 will be directed to the regions of lower resistivity and will melt and amorphize material in those regions. In FIG. 5B, these regions of relatively lower resistivity in PCM 64 that are melted by second pulse signal 54 are regions 88 and 89. Again, the temperature is progressively lower in the concentric regions moving out from centers 88 and 89, such as in regions 86, 84, 82, and 80. Second pulse signal 52 is also illustrated in FIG. 4 over the melt temperature $T_{melt}$ of the phase-change material further away from the center of PCM 64.

In this way, PCM 64 may be fully amorphized during a single reset operation using multiple pulse signals of lower energy level than previously needed. Although one embodiment illustrates two such pulses, three, four or additional other pulses may be used during a single reset operation. Because there is no need to overheat the center of PCM 64 when multiple pulse signals are used, memory cell 60 has better energy efficiency than prior phase-change memory cells. Memory cell 60 in accordance with the present invention also does not risk phase separation of PCM 64 that is sometimes associated with overheating.

In one embodiment, a plurality of memory cells 60 may comprise a memory chip, such that thousands, millions or more of such configured memory cells are resident on the memory chip.

PCM 64 may be made up of a variety of materials in accordance with the present invention. Generally, chalcogenide alloys that contain one or more elements from Column IV of the periodic table are useful as such materials. In one embodiment, the phase-change material 64 of memory cell 60 is made of a chalcogenide compound material, such as GeSbTe or AgInSbTe.

Similarly, the various other components of memory cell 60 may comprise a variety of materials in accordance with the present invention. In one embodiment, first contact 62 may consist of tungsten or titanium nitride composition and second contact 66 can be a tungsten plug. In one embodiment, side insulators 68 are insulator materials such as silicone dioxide. Other insulators may be used as well.

Moreover, the specific configuration of memory cell 60 may have a variety of forms consistent with the present invention. Although memory cell 60 is illustrated as an active-in-via cell of generally cylindrical shape, one skilled in the art will understand that a variety of cells including a portion of phase-change material through which multiple pulse signals are driven may be used consistent with the present invention.

In one embodiment, multiple current or voltage pulses are driven through PCM 64 to melt and amorphize the material during a reset operation. In an alternative embodiment, multiple voltage pulses are applied to PCM 64. In that case, the voltage pulses in a particular reset operation should be of increasing magnitude, taking into account the increase in net resistance of PCM 64 caused by the partial phase change occurring in the material after each additional pulse.

In one embodiment, multiple voltage pulses of a constant magnitude may be used in a single reset in order to draw the largest amount of current a transistor coupled to PCM 64 could supply. If this amount of current is insufficient to melt PCM 64, the next pulse would draw a larger current because the cell resistance will have increased due to the partial phase change occurring in the material.

Because memory cell 60 uses lower peak current or voltage, it allows a more compact size and can be manufactured more cost-efficiently. Stress build-up in memory cell 60 is also less than in systems limited to single-pulse use and the peak temperature is lower.

In one embodiment, first pulse signal 52 is delivered at 1.11 volts and 315 microamps (μA). Second pulse signal 54 is then delivered at 1.33 volts and 308 μA. Between the first and second pulses 52 and 54, PCM 64 is allowed to cool for approximately 5 nanoseconds (ns).

Although multiple pulses are used with some period allowed between the pulses for quenching of the material, the total time required for the multi-pulse reset operation should not significantly influence the net writing step for a plurality of memory cells 60 integrated as a memory chip. For such memory chips, the time required to write a bit is usually determined by the duration of the set operation, which is typically five to ten times longer than the reset operation. Typically, a set operation is 20 to 100 ns longer than a reset operation. Thus, for example, if quench times between the pulses in a multi-pulse reset are in the range of one to 2 ns, and heating pulses themselves are approximately 5 ns, the total time for a multi-pulse reset is still less than 30 ns. This is still less time than a typical set operation.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of resetting a memory cell, the method comprising:

providing a first electrical write pulse to phase-change material within the memory cell;

heating a first portion of the phase-change material with the first write pulse until it is melted;

allowing the first portion of the phase-change material to cool below melting temperate;

providing a second write pulse to the phase-change material within the memory cell;

heating a second portion of the phase-change material with the second write pulse until it is melted; and allowing the second portion of the phase-change material to cool.

2. The method of claim 1 further comprising:

providing a third write pulse to phase-change material within the memory cell;

heating a third portion of the phase-change material with the third write pulse until it is melted; and allowing the third portion of the phase-change material to cool.

3. The method of claim 2 further comprising:

providing a fourth write pulse to phase-change material within the memory cell;

heating a fourth portion of the phase-change material with the fourth write pulse until it is melted; and allowing the fourth portion of the phase-change material to cool.

4. The method of claim 1, wherein heating the first portion and allowing it to cool changes the first portion to an amorphous state having a higher resistivity than remaining portions of the phase-change material.

5. The method of claim 4, wherein upon providing the second write pulse to the phase-change material, the higher resistivity of the first portion causes the heating of the second portion rather than the first portion.

6. The method of claim 1, wherein providing the first write pulse comprises providing one of the group comprising a current pulse and a voltage pulse.

7. The method of claim 1, wherein heating times of the first and second portions are in the range of zero to 5 nanoseconds and cooling times zero to 2 nanoseconds.

8. The method of claim 7, wherein the reset operation takes less than 35 nanoseconds.

9. The method of claim 1, wherein the first write pulse is directed through the phase-change material thereby heating up the material.

10. A memory cell device comprising:

a memory cell having phase-change material capable of being set and capable of being reset;

write pulse means for generating at least first and second write pulse signals for a single reset operation of the memory cell, wherein the first write pulse signal heats and melts a first portion of the phase-change material of the memory cell, and wherein the second write pulse signal heats and melts a second portion of the phase-change material of the memory cell.

11. The memory cell device of claim 10, wherein the first portion of the phase-change material of the memory cell is amorphized after it is heated by the first write pulse and subsequently quenched.

12. The memory cell device of claim 10, wherein the second portion of the phase-change material of the memory cell is amorphized after it is heated by the second write pulse and subsequently quenched.

13. The memory cell device of claim 10, wherein the phase-change material experiences material expansion of less than 15% during the phase change.

14. The memory cell device of claim 10, wherein setting the phase-change material of the memory cell is setting the material to a crystalline state, and wherein resetting the phase-change material of the memory cell is setting the material to an amorphous.

15. The memory cell device of claim 10, the phase-change material is selected from a group comprising GeSbTe, AgInSbTe, GeSb, GaSb, and chalcogenide alloys.

16. A memory device comprising:

a plurality of phase-change memory cells each having phase-change material that can be set and reset;

a write pulse generator that generates at least first and second write pulse signals for a single reset operation; and a distribution circuit for distributing the first and second write pulse signals for a single reset operation to a selected memory cell;

wherein the first write pulse signal heats and melts a first portion of the phase-change material of the selected memory cell, and wherein the second write pulse signal heats and melts a second portion of the phase-change material of the selected memory cell.

17. The memory device of claim 16, wherein the write pulse generated is directed through the phase-change material thereby heating up the material.

18. The memory device of claim 16, the phase-change material is selected from a group comprising GeSbTe, AgInSbTe, GeSb, GaSb, and chalcogenide alloys.

19. The memory device of claim 16 configured in a random access memory device.

20. The memory device of claim 16, wherein the phase-change memory cells, the write pulse means, and the sensor means are all integrated in a single chip.

* * * * *